United States Patent [19]

Shimmura et al.

[11] Patent Number: 4,994,326

[45] Date of Patent: Feb. 19, 1991

[54] SOLDER POWDERS COATED WITH FLUORINE COMPOUNDS, AND SOLDER PASTES

[75] Inventors: Takashi Shimmura, Iruma; Yoshihiro Miyano, Sayama; Nobuo Tajima, Kawagoe; Makoto Inoue, Tokyo, all of Japan

[73] Assignee: Tamura Kaken Co., Ltd., Japan

[21] Appl. No.: 263,551

[22] Filed: Oct. 27, 1988

[30] Foreign Application Priority Data

Oct. 27, 1987 [JP] Japan .................................. 62-269279

[51] Int. Cl.$^5$ ............................................... C08K 9/06
[52] U.S. Cl. ..................................... 428/405; 428/407; 428/460; 523/200; 523/213
[58] Field of Search ............... 428/403, 405, 407, 560; 420/570; 523/200, 213

[56] References Cited

U.S. PATENT DOCUMENTS

4,419,279 12/1983 Abrams ............................. 428/404
4,818,614 4/1989 Fukui et al. ...................... 428/403

Primary Examiner—George F. Lesmes
Assistant Examiner—Christopher Brown
Attorney, Agent, or Firm—King & Schickli

[57] ABSTRACT

A solder powder is coated with an agent that protects the powder from oxidation. The coating agent is substantially insoluble in a vehicle used to make solder pastes. Thus, pastes made with the coated powders also resist oxidation even when exposed to air. A method for making the coated solder powders is also disclosed and claimed.

5 Claims, 5 Drawing Sheets

SOLDER POWDERS COATED WITH FLUORINE COMPOUNDS, AND SOLDER PASTES

TECHNICAL FIELD

The present invention relates to a coated solder powder and a solder paste and, more particularly, to a solder paste for printed wiring boards and a solder powder used therefor.

BACKGROUND OF THE INVENTION

Printed substrates include a substrate comprising a laminated sheet and a pattern formed by etching a copper foil stuck onto its surface according to an electrical circuit, said pattern being designed to be mounted thereon with electrical parts such as resistors and capacitors, and a ceramic substrate comprising a ceramic sheet onto which a circuit pattern of silver/palladium is baked. In order to attach electrical parts on such substrates, for instance, their lead terminals are soldered to a soldering land of said circuit pattern.

In this case, such printed substrates are broken down into one type wherein a circuit pattern is formed along with a soldering land on the side of a printed substrate opposite to the side thereof on which electrical parts are to be mounted, and the other, so-called flat packaged type wherein a circuit pattern is formed along with a soldering land on the side of a printed substrate on which electrical parts are also to be mounted. In either case, for soldering,, a molten solder is supplied to the soldering lands and portions of the electrical parts to be soldered. In the former case, however, a jet solder is supplied for soldering. In the latter case, on the other hand, a solder paste is often previously coated on the soldering land to form a film, which is to be molten at the time of soldering and soldered in place.

Such a solder paste consists essentially of a solder powder, a resinous component such as rosin and a solvent, and additionally includes an activator such as amine hydrochloride, a fluidity-affording agent, etc., if required. This solder paste is then coated on a soldering land of a printed substrate by means of screen printing, a dispenser, transfer printing and the like. Thereafter, electrical parts are supplied to the printed substrate, and the paste film is molten and cooled to complete soldering. In order to carry out such soldering, the previously prepared solder paste is delivered to a soldering site where the steps from paste coating to soldering by melting of a solder are usually carried out in a continuous manner.

In such a case, the previously prepared solder paste is not immediately used, and is often used after the lapse of some days, since solder paste makers are not identical with soldering performers. Even when the solder paste is stored in, e.g., a sealed container in the meantime, the solder powder comprising lead, tin, etc. reacts with a vehicle at room temperature, so that its viscosity increases. For instance, the viscosity may double in one week. As the solder powder is oxidized, such an increase in viscosity is further promoted and, eventually, results in a loss of fluidity sufficient for printing, e.g., screen printing.

Such oxidized solder powders are not completely molten when unoxidized solder powders are molten and agglomerated together at the time of solder melting, so that they separate from the agglomerated solder and remain on a coating position, otherwise they are subjected to delayed melting and made to discrete that solder balls are formed. Problems with such solder balls are that they give rise to a short circuit between conductors, a reduction in soldering strength and a degradation of finished appearance.

In order to eliminate such problems with the oxidation of solder powders, a large amount of an activator for reducing solder oxides may be incorporated into solder pastes. For this activator, a hydrochloride of amines may be used. However, a large amount of this substance may accelerate the corrosion of a soldering land, when remaining on the soldering land after soldering. In order to avoid this, sufficient washing should be carried out after the completion of soldering. However, such washing leads to a lowering of working efficiency and cannot completely be carried out as such. Further, the use of such a larger amount of the amine hydrochloride poses a problem that a reaction product of it with solder powders gives rise to an increase in the viscosity of solder pastes.

In order to prevent such a reaction of solder powders with a vehicle or the oxidation of solder powders, solder pastes are stored in refrigerators. However, a problem with this is that when the solder pastes are used, they have to be restored to normal temperature, resulting in a drop of workability.

In the preparation of solder pastes, a solder ingot is finely powderized by, e.g., atomization, immediately followed by kneading with a vehicle. In some cases, however, solder powders are kneaded with a vehicle after the lapse of some time from the preparation of solder powders for consideration of working requirements. In the meantime, the solder powders may be transported. Even in such a case, the solder powders are oxidized upon exposure to air, so that when formed into a solder paste, its viscosity increases markedly, as already mentioned. For that reason, the solder powders are stored in a vacuum, or inert gas atmosphere to avoid oxidation. However, this needs special equipment troublesome to handle. In this respect, improvements have also been desired.

SUMMARY OF THE INVENTION

A first object of the present invention is to provide a coated solder powder which is prevented from oxidization not only upon being allowed to stand in air but also when used as the solder powder for solder pastes.

A second object of the present invention is to make convenient the storage, transportation and handling of solder powders and solder pastes using them in air by the achievement of the first object.

A third object of the present invention is to suppress an increase in the viscosity of solder pastes and maintain their printability over an extended period of time.

A fourth object of the present invention is that when a solder paste film coated on a printed substrate is melted, unmelting of oxidized solder powders, which may otherwise bring about solder balls, are prevented, thereby avoiding a short-circuit between conductors, a decrease in soldering strength and a degradation of appearance.

A fifth object of the present invention is to suppress the oxidation of solder without containing therein a large amount of an activator for reducing solder oxides, thereby dispensing with any step for sufficient washing of a printed substrate especially after soldering is applied thereto with a solder paste.

A sixth object of the present invention is to suppress the oxidation of solder powders during storage or transportation, thereby providing a merit that a scheme to produce solder pastes using such solder powders can freely be worked out.

A seventh object of the present invention is to provide solder powders and pastes improved in view of their preparation, handling and performance by the achievement of the above-mentioned objects, whereby the workability of performance of soldering with said solder pastes are much more improved.

DETAILED DESCRIPTION OF THE INVENTION

In order to attain the above-mentioned objects, the present invention provides a coated solder powder characterized in that solder powder granules are coated by a coating agent insoluble or hardly soluble in a vehicle used for solder pastes.

The present invention also provides a method for the preparation of solder powders characterized by including the steps of granulating molten solder by blowing an inert gas thereto while dropping and, immediately thereafter, immersing the thus granulated solder in a coating solution containing a coating agent.

Further, the present invention provides a solder paste characterized by containing a coated solder powder obtained by coating solder powder granules by a coating agent insoluble or hardly soluble in a vehicle.

The present invention will now be explained in detail.

The coated solder powders used in the present invention are obtained by coating solder powders with a coating agent. As such solder powders, use may be made of powders prepared by, e.g., atomization, i.e., by melting an ingot of solder and blowing an inert gas, etc. thereto, while dropping, for atomization and having various particle sizes (of e.g., up to 100 mesh) and shapes (spherical or amorphous). The compositions to this end are set out in the following table, inclusive of 63Sn/37Pb and 62Sn/36Pb/2Ag by way of example.

| ALLOY COMPOSTIONS | MELTING TEMPERATURE | | SPECIFIC GRAVITY $g/cm^3$ | TENSILE STRENGTH $Kg/mm^2$ | SHEARING FORCE $Kg/mm^2$ | ELECTRICAL CONDUCTIVITY (CONDUCTIVITY OF Cu.100) |
|---|---|---|---|---|---|---|
| | SOLID PHASE | LIQUID PHASE | | | | |
| 63Sn/37Pb | 183 | 183 | 8.4 | 5.33 | 284;4.20 | 11.9 |
| 60Sn/40Pb | 183 | 190 | 8.5 | 5.36 | 3.47 | 11.6 |
| 50Sn/50Pb | 183 | 216 | 8.9 | 4.73 | 3.15;4.10 | 10.9 |
| 40Sn/60Pb | 183 | 238 | 9.3 | 3.80 | 3.60 | 10.3 |
| 30Sn/70Pb | 183 | 255 | 9.7 | 3.73 | 3.47 | 9.3 |
| 25Sn/75Pb | 183 | 266 | 10.0 | 3.50 | 3.15 | 8.9 |
| 15Sn/85Pb | 227 | 288 | 10.5 | 3.35 | 2.90 | 8.5 |
| 10Sn/90Pb | 268 | 299 | 10.8 | 3.15 | 2.45 | 8.3 |
| 5Sn/95Pb | 305 | 312 | 11.1 | 2.75 | 1.90 | 7.8 |
| 62Sn/36Pb/2Ag | 177 | 189 | 8.4 | 7.20 | | |
| 59.5Sn/34.5Pb/6Ag | 177 | 177 | 8.5 | 5.89 | | |
| 96.5Sn/3.5Pb | 221 | 221 | 7.4 | 1.98 | | 14.0 |
| 95Sn/5Ag | 177 | 189 | 8.4 | 7.20 | | 12.6 |
| 42Sn/42Pb/14Bl/2Ag | 160 | 160 | 9.1 | | | |
| 10Sn/88Pb/2Ag/ 268 | 302 | 10.8 | | | | |
| 5Sn/92.5Pb/2.5Ag | 280 | 280 | 11.1 | 4.50 | | 8.1 |
| 1Sn/97.5Pb/1.5Ag | 309 | 309 | 11.3 | 3.06 | 2.13;2.49 | 7.5 |
| 100Sn | 232 | 232 | 7.3 | 1.49 | 2.02 | 15.6 |
| 95Sn/5Pb | 232 | 240 | 7.3 | 4.09 | | 13.0 |
| 45Sn/40Pb/15Bl | | 162 | 8.9 | | | 0.7 |
| 43Sn/43Pb/14Bl | 144 | 163 | 9.0 | | | |
| 50Sn/32Pb/18Cd | 145 | 145 | 6.1 | | | |
| 80Au/20Sn | 280 | 280 | 14.5 | 29.0 | | 7.7 |

The coating agents to be used are insoluble or hardly soluble in a vehicle for solder pastes to be described later, and may include those based on silicone and fluorine such as, for instance, silicone oils, silicone base high-molecular compounds, fluorinated silicone oils, fluorosilicone resins and fluorinated hydrocarbon base high-molecular compounds.

Representative Silicone Base Coating Agents

Polon L, Polon T, KF96, KS-701, KS-707, KS-705F, KS-706, KS-709S, KS-711, KSIX-712, KS-62F, KIS-62M, KS-64, Silicolube G-430, Silicolube G-540 and Silicolube G-541, all manufactured by The Shin-Etsu Chemical Co., Ltd.

SH-200, SH-210, SH-1109, SH-3109, SH-3107, SH-3108, SH-8011, FS-1265, Syli-off 23 and DC pan Glaze 62, all manufactured by Toray Silicone Co., Ltd.

Representative Fluorine Base Coating Agents

Dai-Free MS-443, MS-543, MS-743, MS-043, ME-413 and ME-810, all manufactured by Daikin Kogyo Co., Ltd.

Fluolard FC-93, FC-95, FC-98, FC-129, FC-134, FC-430, FC-431 and FC-721, all manufactured by Simitomo 3M Co., Ltd.

Sumiflunon FP-81, FP-81R, FP-82, FP-84C, FP-84R and FP-86, all manufactured by Sumitomo Chemical Co., Ltd.

Surfron SR-100 and SR-100X, both manufactured by Seibi Chemical Co., Ltd.

EF-125DS and EF-1200, both manufactured by Sin-Akita Kasei Co., Ltd.

These fluorine based coating agents have a number of formulae including, for example, FC-721 manufactured by Simitomo 3M Company, Ltd., which comprises a mobile solution of an oleophobic-hydrophobic fluorochemical polymer in Freon TF (trichlorotrifluoroethane).

These coating agents may be used alone or in combination. Particular preference is given to the high-molecular coating agents.

In order to coat the aforesaid solder powders with such a coating agent(s), the coating agent is mixed with a solvent to prepare a treating solution. Immediately thereafter, the solder powders prepared by, e.g., atomization are successively immersed in that solution under agitation. As the solvent to this end, it is preferred to use a halogenated hydrocarbon such as 1, 1, 1-trichloroethane. Preferably, the concentration of the coating agent in the solvent is 0.01 to 2% (calculated as solid).

After stirring, the solution is allowed to stand for 5 minutes to 1 hour, and is then separated into liquid and solid phases by decantation, centrifugation or filtration. Afterwards, the solid phase may be dried by either natural or air drying in either an inert gas or vacuum atmosphere at either normal temperature or under heating condition. Such drying conditions may be applied in combination.

When preparing the solder powders by atomization, an inert gas is blown thereto. However, the solder powders may be coated on their surfaces by blowing thereto this gas with the aforesaid treating solution In this case, the solder powders may also be immersed in the aforesaid treating solution.

The coated solder powders may be obtained in this manner. The coated film may be identified for its type by pyrolysis gas chromatography, and may be presumed for its coated amount by Auger electron spectroanalysis. When a carbon-containing compound is used as the coating agent, a quantitative analysis value for carbon is preferably 30 to 70 mol %.

In order to form the coated solder powders of the present invention into solder pastes, they are mixed with a vehicle. In the solder pastes, a flux is used as the vehicle. This flux may be prepared from essential components of a resin and a solvent, into which a thixotropic agent, a solvent, etc. may be incorporated, if required.

Depending upon activity, the flux is classified into three types (R: Inert, RMA: Moderately Active and RA: Active) according to the MIL standard, U.S.A. (MIL-F-14256). However, fluxes of the RA or RMA class may be generally, but not exclusively, used for solder pastes.

As the activators for such a vehicle, use may be made of inorganic salts of amines such as aniline hydrochloride, organic salts of amines, amines, organic acids and halogenated hydrocarbons.

As the solvents, use may be made of alcohols, esters, ketones, aromatic solvents and the like, for instance, benzyl alcohol, ethanol, isopropyl alcohol, butanol, ethyl cellosolve, butyl cellosolve, butyl carbitol, ethyl carbitol, butyl acetate, butyl cellosolve acetate, benzyl acetate, cyclohexanone, isophorone, nitrobenzene, terpineol, toluene, xylene, tetralin, decalin, etc.

As the thixotropic agents, use may be made of inorganics such as kaolin and aerosil (manufactured by Nippon Aerosil Co., Ltd.) and organics such as organic bentonite and hardened castor oil.

The solder pastes of the present invention may be obtained by stirring and mixing of a composition consisting essentially of 83 to 94% by weight of the coated solder powders, 4.5 to 7.5% by weight of the resin and 2.5 to 5.5% by weight of the solvent, into which 0.02 to 2.0% by weight of the activator and 0.03 to 1.0% by weight of the thixotropic agent are incorporated, if required. For mixing means, a planetary mixer, etc., may be used.

In the thus obtained solder pastes, the solder powders are coated with the coating agent(s) and the film of the coating agent is insoluble or hardly soluble in the resin, solvent, etc. of the vehicle, so that the solder powders are prevented from reacting with the vehicle or the atmospheric air due to being shielded from the outside by the coated film, thereby maintaining the viscosity stability of the solder pastes.

On the other hand, when this solder paste is applied, dried and melted on a soldering land of a printed substrate to wet portions of electrical parts to be soldered, the coated solder powders are melted and separated from their surface coated films. Thereafter, the molten solder is coalesced together, and is cooled to solder the electrical parts onto a soldering land. In this case, if the film of the coating agent is thinned, its influence is then negligible. This film should preferably be meltable at the melting temperature of solder, but may be unmelted.

According to one aspect of the present invention, there can be provided the coated solder powders which are very easy to handle, since they are prevented from oxidation even when they are stored or transported in air. Since the preparation of the solder powders and solder pastes can also separately be carried out at an interval of some time, a scheme to produce solder pastes can easily be worked out.

According to another aspect of the present invention wherein molten solder is granulated while dropping, and is immediately thereafter immersed in the coating solution, the coated solder powders can easily be obtained at low costs by making use of a conventional atomizer.

According to still another aspect of the present invention, since there can be provided solder pastes using the coated solder powders, a change in the viscosity of the solder pastes can be limited so remarkably that they can maintain printability over an extended period of time. Such solder pastes can be stored at lower storage costs and easily handled particularly because they can be kept at normal temperature with no need of refrigeration.

Thus, the present invention gives a great deal of merits to the production and handling of solder powders and pastes. Soldering of printed substrates using such solder pastes makes the most suitable coating possible over an extended period without damaging the printability thereof. In addition, such an accident as a short-circuit of unnecessary portions due to solder balls formed at the time of melting of the coated film is avoided and much more improved soldering properties such as high soldering strength and good appearance are achieved.

EXAMPLES

The present invention will be now be explained in detail with reference to the following non-restrictive examples.

EXAMPLE 1

An ingot of a solder alloy (63% by weight Sn and 37% by weight Pb) is melted and atomized into fine alloy powder granules of 250 to 400 mesh, which were immediately put into 20 Kg of a treating solution and stirred therein. This treating solution is a 50% solution (with a 1% solid content) obtained by dissolving 500 g of the aforesaid Fluolard FC-721 in 1 Kg of Freon (manufactured by Du Pont). The above operation is continued until 10 Kg of solder powders are charged into the treating solution, and the solution is then allowed to stand for 30 minutes. Afterwards, the supernatant liquid is decanted out of the product, which is then naturally dried.

Figure 1:
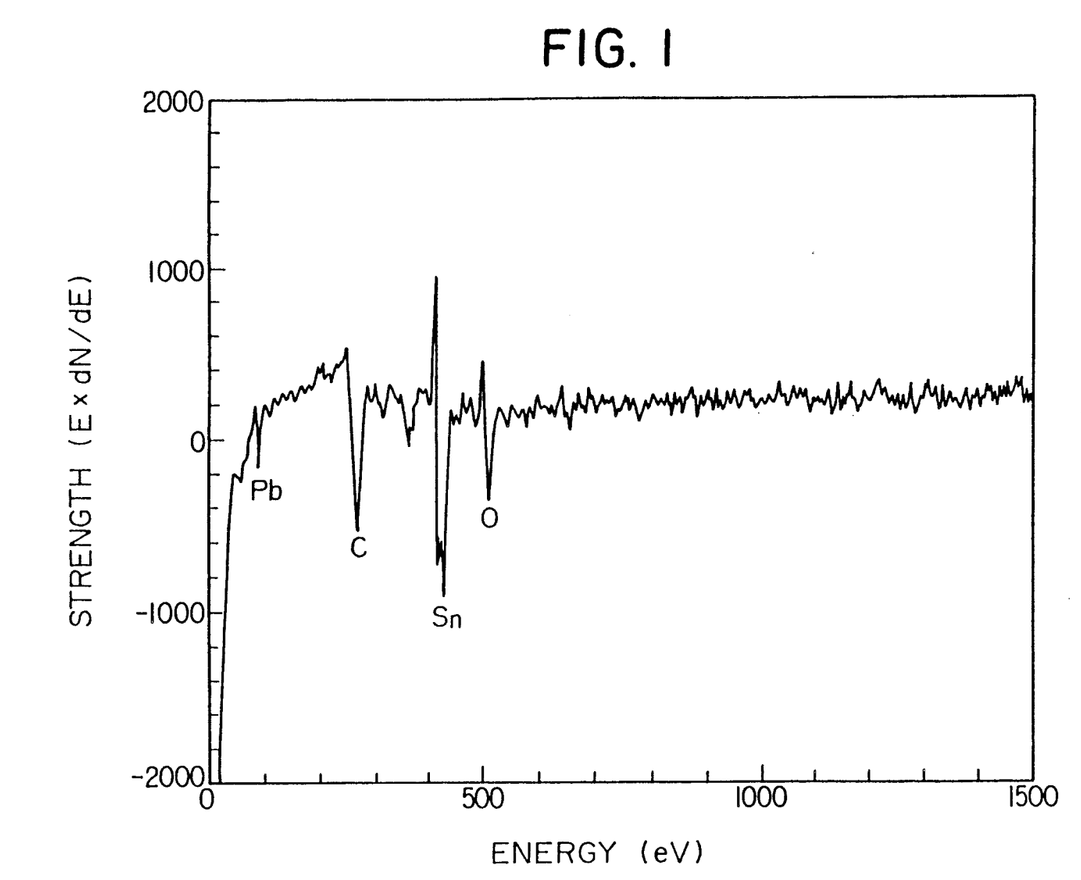
FIG. 1 shows Auger electron spectroanalysis spectra of one example of the coated solder powder according to the present invention.
Figure 2:
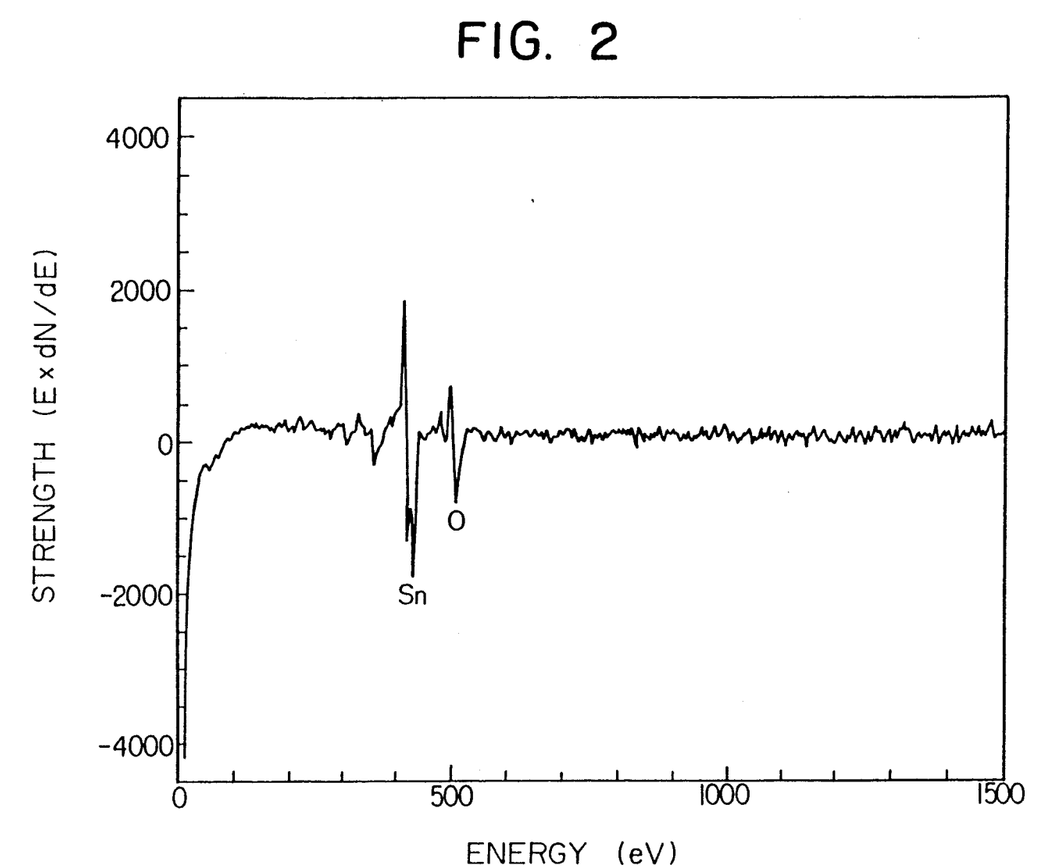
FIG. 2 shows Auger electron spectroanalysis spectra of that solder powder prior to coating.

The coated solder powders were obtained in this manner. The results, as shown in FIG. 1, were obtained by Auger electron spectroanalysis of the solder powder. It is to be noted that the Auger electron spectroanalysis results of the solder powder prior to coating are shown in FIG. 2. From these figures, it is found that carbon (C) is not substantially detected from the solder powder prior to coating, whereas a sharp peak showing the presence of carbon (C) is detected from the solder powder after coating. By calculation, C, Sn and O are 58.6 mol %, 17.8 mol % and 23.6 mol %, respectively, and the thickness of the coated layer is about 60 mol %, calculated as C.

It is to be understood that even when the above coated solder powders were allowed to stand at normal temperature in air, similar spectra as shown in FIG. 1 were obtained as a result of the same Auger electron spectroanalysis as mentioned above. This indicates that there was no change-with-time in the coated film of the solder powders.

It is also to be understood that Auger electron spectroanalysis was carried out with the solder powders, as obtained above, held under pressure on an indium (In) sheet.

Figure 3:
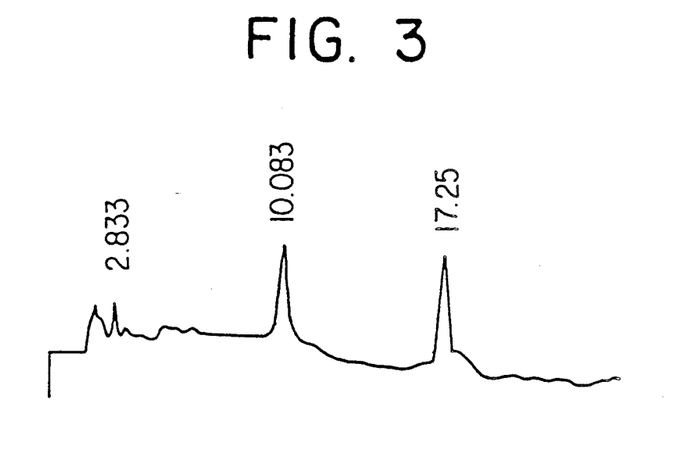
FIG. 3 is a pyrolysis gas chromatogram of the same sample as used in FIG. 1.
Figure 4:
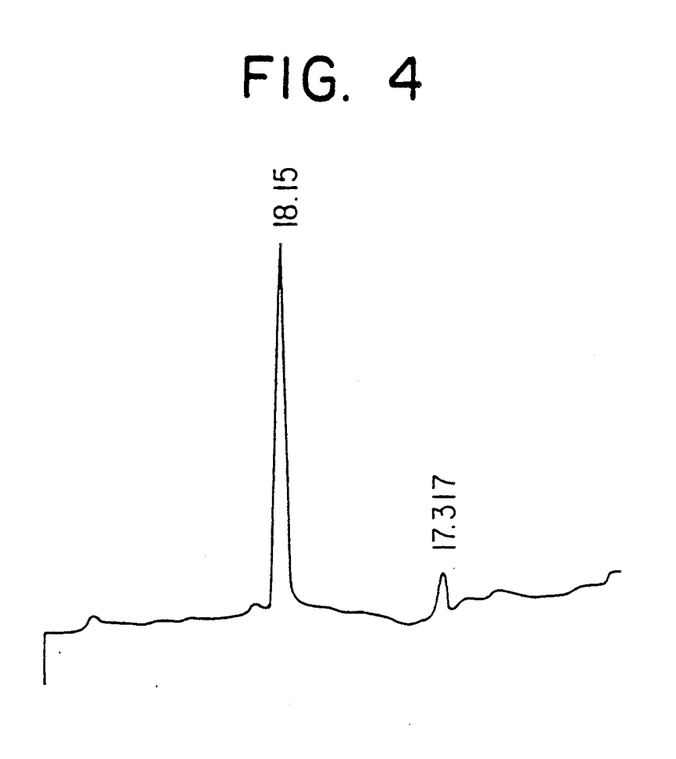
FIG. 4 is a gas chromatogram of the same sample as used in FIG. 2.

Using a gas chromatography GC-7APTF manufactured by Shimadzu Corporation together with PYR-2A (a pyrolysis unit) manufactured by the same corporation, an analysis was made of gases emitted when 0.16 g of the above coated solder powders were heated at 500° C in a nitrogen gas. The results are illustrated in FIG. 3. A similar analysis was also made of 1 ml of the above treating solution. The results are shown in FIG. 4. By calculation, the holding time and area ratio of the peaks shown in these figures are as follows.

|  | FIG. 3 | | FIG. 4 | |
| --- | --- | --- | --- | --- |
|  | H. T. (min) | A. R. | H. T. (min) | A. R. |
| 1st Component | 2.83 | 7.18 | — | — |
| 2nd Component | 18.88 | 42.67 | 18.15 | 90.46 |
| 3rd Component | 17.25 | 50.15 | 17.32 | 9.54 |

H. T.: Holding Time and A. R.: Area Ratio

From these, it was confirmed that due to the main peaks being coincident with each other, the coated film of the coated solder powders was identical with the resin Fluolard FC-721 used for the treating solution. It is to be understood that the measuring conditions for gas chromatography were:

Column: PEG-6000 (polyethylene glycol),
Column Temp. Heated from 100° C to 180° C at a rate of 3° C/min.,
Carrier Gas: Nitrogen.
Flow Rate: 50 ml/min.,
Detector: FID (a hydrogen ion detector), and
Pouring Temp.: 230° C With the coated solder powders as obtained above, the following solder paste was prepared.

Figure 5:
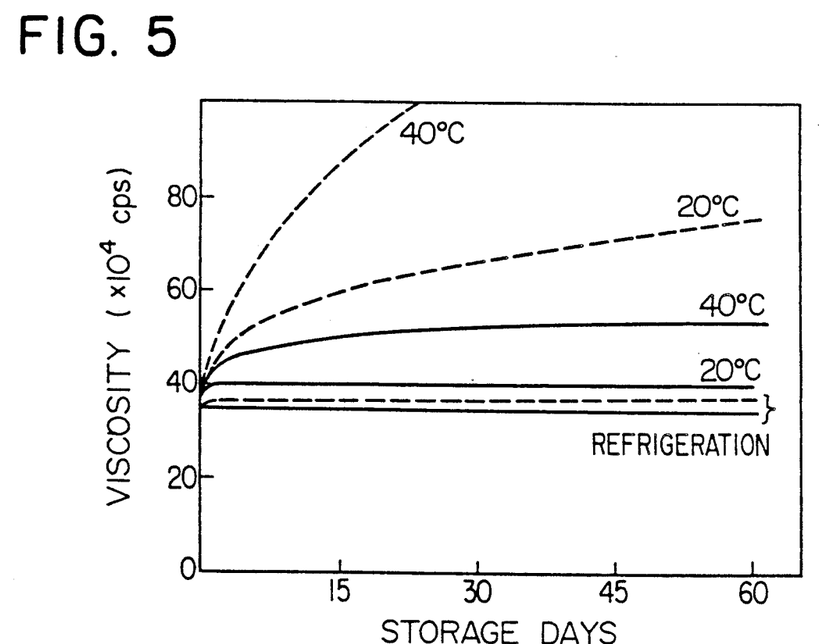
FIG. 5 is a graph showing the viscosity, as measured, of one example of the solder paste obtained using the same samples as used in FIGS. 1 and 2.

Coated Solder Powders (63% Sn/37 %Pb): 90 parts by weight
Polymerized Rosin: 5.8 parts by weight
Hydrogenated Castor Oil (Castor Wax): 0.4 parts by weight
Dimetylamine Hydrochloride: 0.05 parts by weight
Butyl Carbitol: 3.75 parts by weight The above components were stirred and mixed together at normal temperature for 30 minutes. Afterwards, the mixture was further stirred and mixed with the solvent and solder powders, and the resulting product was regulated to a viscosity of 360,000 cP. The obtained paste was refrigerated and stored at 20° C and 40° C, respectively. The results are shown by solid lines in FIG. 5. The same procedures as mentioned above were repeated except that the solder powders before coating were used in place of the coated solder powders, thereby preparing a similar solder paste which was similarly measured in terms of viscosity. The results are shown by dotted lines in FIG. 5. It is to be understood that the viscometer used was of the Brookfield HBT type.

From these results, it is found that the solder paste using the coated solder powders excels in viscosity stability at 20° C (room temperature).

EXAMPLE 2

Figure 6:
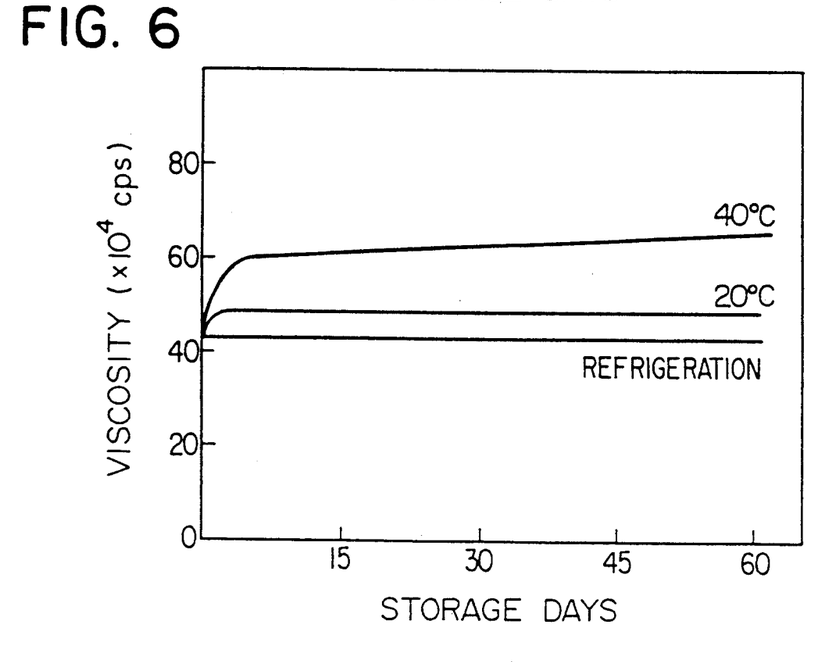
FIG. 6 is a graph showing the viscosity, as measured, of another example of the solder paste.

In a similar manner as described in Ex. 1, an ingot of a solder alloy (62% Sn/36% Pb/2% Ag) was used to prepare coated solder powders, a solder paste having the following composition was prepared with such solder powders in a similar manner as in Ex. 1, and measurements were made in a similar manner as in Ex. 1. The results are shown in FIG. 6.

Coated Solder Powders

| Coated Solder Powders (62% Sn/36% Pb/2% Ag) | 90 weight parts |
| --- | --- |
| Polymerized Rosin | 5.8 weight parts |
| Hydrogenated Castor Oil | 0.4 weight parts |
| Dimethylamine Hydrochloride | 0.05 weight parts |
| Butyl Carbitol | 3.75 weight parts |

EXAMPLE 3

Figure 7:
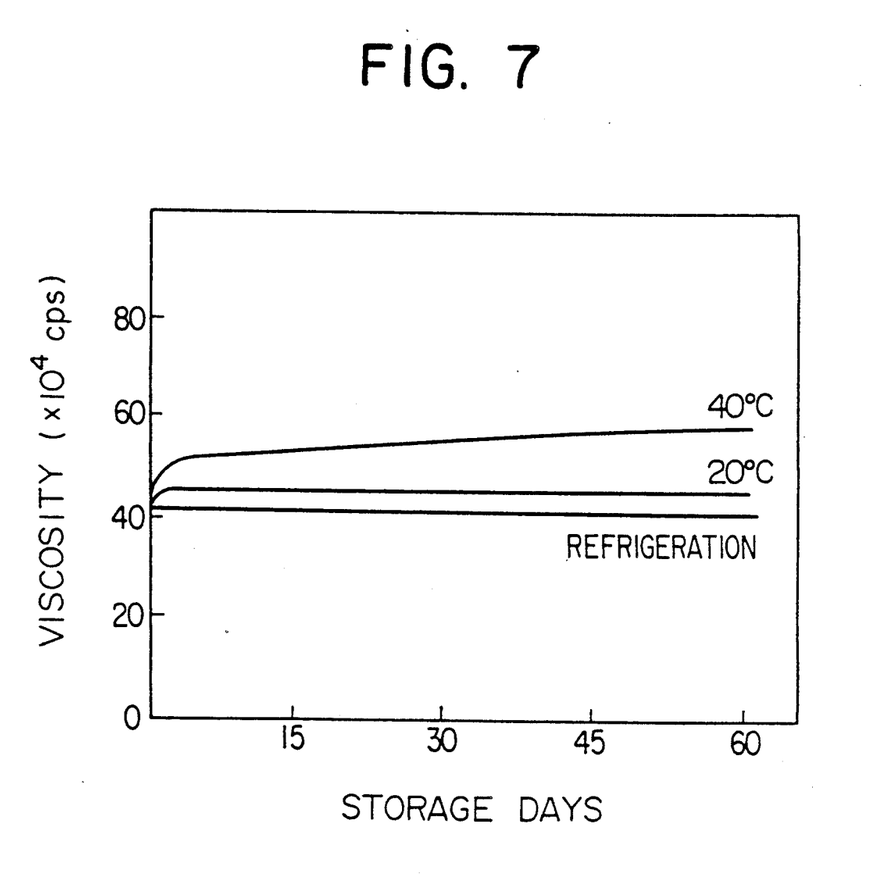
FIG. 7 is a graph showing the viscosity, as measured, of yet another example of the solder paste.

With the coated solder powders of Ex. 1, a solder paste having the following compostion was prepared in a similar manner as described in Ex. 1, and measurements were made in a similar manner as in Ex. 1. The results are shown in FIG. 7.

| Coated Solder Powders (63% Sn/37% Pb) | 90 weight parts |
| --- | --- |
| Polymerized Rosin | 5.50 weight parts |
| Hydrogenated Castor Oil | 0.40 weight parts |

| | |
|---|---|
| (Castor Wax) | |
| Dimethylamine Hydrochloride | 0.20 weight parts |
| Butyl Carbitol | 3.90 weight parts |

We claim:

1. A coated solder powder wherein solder powdered granules are coated with a coating agent comprising a fluorine compound insoluble or hardly soluble in a vehicle used for solder paste so as to substantially prevent oxidation of the granules, said fluorine compound being selected from a group consisting of fluorinated silicone oils, fluorinated hydrocarbon base high-molecular compounds fluorosilicone resins and any mixtures thereof.

2. A coated solder powder as claimed in claim 1, wherein when using a carbon-containing fluorine compound as said coating agent, a quantitative analysis value for carbon by Auger electron spectroanalysis is 30 to 70 mol %.

3. A coated solder powder wherein solder powdered granules are coated with a coating agent comprising a fluorine compound insoluble or hardly soluble in a vehicle used for solder paste so as to substantially prevent oxidation of the granules, said fluorine compound being an oleophobic-hydrophobic fluorochemical polymer in trichlorotrifluoroethane.

4. A solder paste containing a coated solder powder having solder granules coated with a coating agent comprising a fluorine compound selected from a group consisting of fluorinated silicone oils, fluorinated hydrocarbon base high-molecular compounds fluorosilicone resins and any mixtures thereof insoluble or hardly soluble in a vehicle used for solder pastes, oxidation of said solder powder being substantially prevented to maintain a printable state with respect to a substrate for an extended period of time, and forming a solder substantially free from oxidized solder powders, even when a printed solder paste film is melted.

5. A solder paste as claimed in claim 4, which contains 83 to 94% by weight of said solder powder, 4.5 to 7.5% by weight of a resin and 2.5 to 5.5% by weight of a solvent.

* * * * *